US009248589B2

United States Patent
Kijima et al.

(10) Patent No.: US 9,248,589 B2
(45) Date of Patent: Feb. 2, 2016

(54) METHOD FOR MANUFACTURING FERROELECTRIC FILM

(76) Inventors: Takeshi Kijima, Chiba (JP); Yuuji Honda, Chiba (JP)

(*) Notice: Subject to any disclaimer, the term of this patent is extended or adjusted under 35 U.S.C. 154(b) by 213 days.

(21) Appl. No.: 14/235,207

(22) PCT Filed: Jul. 29, 2011

(86) PCT No.: PCT/JP2011/067909
§ 371 (c)(1),
(2), (4) Date: Apr. 4, 2014

(87) PCT Pub. No.: WO2013/018232
PCT Pub. Date: Feb. 7, 2013

(65) Prior Publication Data
US 2014/0225317 A1    Aug. 14, 2014

(51) Int. Cl.
*B29C 39/00* (2006.01)
*C01G 33/00* (2006.01)
*H01L 21/02* (2006.01)

(52) U.S. Cl.
CPC ............ *B29C 39/003* (2013.01); *C01G 33/006* (2013.01); *H01L 21/02197* (2013.01); *H01L21/02282* (2013.01); *C01P 2002/34* (2013.01); *C01P 2002/72* (2013.01); *C01P 2004/03* (2013.01)

(58) Field of Classification Search
CPC ............ C04B 35/624; C04B 38/0045; C04B 41/4537; C04B 2235/6023; H01L 21/0297; H01L 21/02282
See application file for complete search history.

(56) References Cited

U.S. PATENT DOCUMENTS

| 5,443,746 A * | 8/1995 | Harris ................. C04B 35/4682 252/62.54 |
| 7,253,017 B1 * | 8/2007 | Roscheisen ............ B82Y 30/00 136/250 |
| 2006/0222872 A1 | 10/2006 | Higuchi et al. |

(Continued)

FOREIGN PATENT DOCUMENTS

| JP | 2002-151754 | 5/2002 |
| JP | 2006-279713 | 10/2006 |

(Continued)

OTHER PUBLICATIONS

International Search Report issued Nov. 15, 2011 in International Application No. PCT/JP2011/067909.

*Primary Examiner* — Erin Snelting
(74) *Attorney, Agent, or Firm* — Wenderoth, Lind & Ponack, L.L.P.

(57) ABSTRACT

To provide a method for manufacturing a ferroelectric film formed of a lead-free material. The method for manufacturing a ferroelectric film according to an aspect of the present invention is a method for manufacturing a ferroelectric film including the steps of pouring a sol-gel solution for forming $(K_{1-X}Na_X)NbO_3$ into a mold 3, calcining the sol-gel solution to form a $(K_{1-X}Na_X)NbO_3$ material film inside the mold 3, heat-treating and crystallizing the $(K_{1-X}Na_X)NbO_3$ material film in an oxygen atmosphere to form a $(K_{1-X}Na_X)NbO_3$ crystallized film inside the mold 3 and removing the mold 3 through etching, and is characterized in that the mold 3 is more easily etched than the $(K_{1-X}Na_X)NbO_3$ crystallized film and the X satisfies a formula below $$0.3 \leq X \leq 0.7.$$

29 Claims, 7 Drawing Sheets

(56) References Cited

U.S. PATENT DOCUMENTS

| | | | |
|---|---|---|---|
| 2007/0126313 A1* | 6/2007 | Ueno | H03H 9/02031 310/311 |
| 2007/0271750 A1 | 11/2007 | Hamada et al. | |
| 2009/0177049 A1* | 7/2009 | Eriksson | A61N 1/056 600/301 |

FOREIGN PATENT DOCUMENTS

| | | |
|---|---|---|
| JP | 2007-314378 | 12/2007 |
| JP | 2009-10367 | 1/2009 |
| WO | 2006/087777 | 8/2006 |
| WO | 2010/122707 | 10/2010 |

* cited by examiner (A)

(B)

(A)

(B)

BIT (BLT)

- A SITE ION
- A' SITE ION
- B SITE ION

METHOD FOR MANUFACTURING FERROELECTRIC FILM

TECHNICAL FIELD

The present invention relates to a method for manufacturing a ferroelectric film.

BACKGROUND ART

A conventional method for manufacturing a Pb(Zr,Ti)O$_3$ (hereinafter, referred to as "PZT") film will be explained.

On a 4-inch wafer, a Pt film (111)-oriented, for example, is formed, and on the Pt film, a PZT sol-gel solution is spin-coated by a spin coater. Next, the coated PZT sol-gel solution is heated and held on a hot plate to be dried, and the moisture is removed. After that, it is furthermore heated and held on a hot plate kept at higher temperature to be calcined. The repetition of the process a plurality of times generates amorphous PZT.

Next, the amorphous PZT having been calcined is subjected to an annealing treatment by using a pressurizing-type lamp annealing device (RTA: rapidly thermal anneal) and PZT crystallization is performed. The crystallized PZT film has a perovskite structure. (For example, see Patent Document 1)

On the other hand, PZT has the Tc existing at 300° C. or higher, and has good ferroelectric properties and piezoelectric properties, but in circumstances where the whole industrial world aims at making lead free, the problem to be solved is to attain lead-free PZT.

CITATION LIST

Patent Document

[Patent Document 1] WO 2006/087777

DISCLOSURE OF THE INVENTION

Problems to be Solved by the Invention

As described above, in the industrial world, the production of a ferroelectric film formed of a lead-free material is required.

An aspect of the present invention aims at providing a method for manufacturing a ferroelectric film formed of a lead-free material.

Means for Solving the Problems (1) to (18) below explain a plurality of aspects of the present invention.

(1) A method for manufacturing a ferroelectric film including the steps of:
pouring a sol-gel solution for forming (K$_{1-x}$Na$_x$)NbO$_3$ into a mold;
forming, by calcining the sol-gel solution, a (K$_{1-x}$Na$_x$)NbO$_3$ material film in the mold;
forming, by heat-treating and crystallizing the (K$_{1-x}$Na$_x$)NbO$_3$ material film in an oxygen atmosphere, a (K$_{1-x}$Na$_x$)NbO$_3$ crystallized film in the mold; and
removing the mold through etching, wherein
the mold is more easily etched than the (K$_{1-x}$Na$_x$)NbO$_3$ crystallized film; and
the X satisfies the formula below $$0.3 \leq X \leq 0.7.$$

(2) A method for manufacturing a ferroelectric film, including the steps of:
forming a mold on a substrate;
pouring a sol-gel solution for forming (K$_{1-x}$Na$_x$)NbO$_3$ into the mold;
forming, by calcining the sol-gel solution, a (K$_{1-x}$Na$_x$)NbO$_3$ material film in the mold;
forming, by heat-treating and crystallizing the (K$_{1-x}$Na$_x$)NbO$_3$ material film in an oxygen atmosphere, a (K$_{1-x}$Na$_x$)NbO$_3$ crystallized film in the mold; and
forming, by removing the mold through etching, the (K$_{1-x}$Na$_x$)NbO$_3$ crystallized film on the substrate, wherein
the X satisfies the formula below $$0.3 \leq X \leq 0.7.$$

(3) A method for manufacturing a ferroelectric film, including the steps of:
forming a first electrode on a substrate;
forming a mold on the first electrode and the substrate;
pouring a sol-gel solution for forming (K$_{1-x}$Na$_x$)NbO$_3$ into the mold;
forming, by calcining the sol-gel solution, a (K$_{1-x}$Na$_x$)NbO$_3$ material film in the mold;
forming, by heat-treating and crystallizing the (K$_{1-x}$Na$_x$)NbO$_3$ material film in an oxygen atmosphere, the (K$_{1-x}$Na$_x$)NbO$_3$ crystallized film in the mold; and
forming, by removing the mold through etching, the (K$_{1-x}$Na$_x$)NbO$_3$ crystallized film on the first electrode, wherein
the X satisfies the formula below $$0.3 \leq X \leq 0.7.$$

(4) The method for manufacturing a ferroelectric film according to the above (3), wherein:
after calcining the sol-gel solution and before heat-treating the (K$_{1-x}$Na$_x$)NbO$_3$ material film, an electrode material film is formed on the (K$_{1-x}$Na$_x$)NbO$_3$ material film and the mold; and
by removing the electrode material film positioned on the mold when removing the mold through etching, a second electrode formed of the electrode material film is formed on the (K$_{1-x}$Na$_x$)NbO$_3$ crystallized film.

(5) The method for manufacturing a ferroelectric film according to any one of the above (1) to (4), wherein the total concentration of K, Na and Nb contained in the sol-gel solution is 10 to 50 mol %.

(6) The method for manufacturing a ferroelectric film according to any one of the above (1) to (5),
wherein, when forming the (K$_{1-x}$Na$_x$)NbO$_3$ material film, a (K$_{1-x}$Na$_x$)NbO$_3$ material film is formed by repeating a plurality of times the pouring of the sol-gel solution and the calcination.

(7) The method for manufacturing a ferroelectric film according to any one of the above (1) to (6),
wherein a first crystalline oxide film preferentially oriented to (001) is formed, in a contact state, on at least one of the upper side and lower side of the (K$_{1-x}$Na$_x$)NbO$_3$ crystallized film.

According to the method for manufacturing a ferroelectric film, due to the formation, in a contact state, of the first crystalline oxide film preferentially oriented to (001) on at least one of the upper side and lower side of the (K$_{1-x}$Na$_x$)NbO$_3$ crystallized film, the (K$_{1-x}$Na$_x$)NbO$_3$ material film can be crystallized, oriented to (001).

(8) A method for manufacturing a ferroelectric film, including the steps of:

forming a mold on a substrate;

pouring a first sol-gel solution for forming $(K_{1-X}Na_X)NbO_3$ into the mold;

forming, by calcining the first sol-gel solution, a first $(K_{1-X}Na_X)NbO_3$ material film in the mold;

pouring a second sol-gel solution for forming a first crystalline oxide film into the mold;

forming, by calcining the second sol-gel solution, a material film for forming a crystalline oxide film in the mold and on the first $(K_{1-X}Na_X)NbO_3$ material film;

pouring a third sol-gel solution for forming $(K_{1-X}Na_X)NbO_3$ into the mold;

forming, by calcining the third sol-gel solution, a second $(K_{1-X}Na_X)NbO_3$ material film in the mold and on the material film for forming a crystalline oxide film;

forming, by heat-treating and crystallizing the material film for forming a crystalline oxide film and the first and second $(K_{1-X}Na_X)NbO_3$ material films in an oxygen atmosphere, a first $(K_{1-X}Na_X)NbO_3$ crystallized film, a first crystalline oxide film preferentially oriented to (001) and a second $(K_{1-X}Na_X)NbO_3$ crystallized film stacked in order in the mold; and removing the mold through etching, wherein the X satisfies the formula below $$0.3 \leq X \leq 0.7.$$

(9) The method for manufacturing a ferroelectric film according to the above (7) or (8), wherein the first crystalline oxide film has higher dielectric constant than the $(K_{1-X}Na_X)NbO_3$.

The "higher dielectric constant" referred to here means that the dielectric constant of the whole first crystalline oxide film is higher than the dielectric constant of the whole $(K_{1-X}Na_X)NbO_3$ film, that is, it means so-called real dielectric constant.

(10) The method for manufacturing a ferroelectric film according to any one of the above (7) to (9), wherein the first crystalline oxide film is a bismuth layered-structure ferroelectric film having a perovskite structure or a tungsten-bronze type ferroelectric film.

(11) The method for manufacturing a ferroelectric film according to any one of the above (7) to (10), wherein the first crystalline oxide film is formed in an island shape or in a film shape.

(12) The method for manufacturing a ferroelectric film according to any one of the above (7) to (11), wherein a thickness of the first crystalline oxide film is 2 to 30 nm.

The thickness of the first crystalline oxide film referred to here means, when the first crystalline oxide film is formed only on one of the upper side and lower side of the $(K_{1-X}Na_X)NbO_3$ film, the thickness thereof, and means, when the first crystalline oxide film is formed on both the upper side and lower side of the $(K_{1-X}Na_X)NbO_3$ film, the sum of the both thicknesses.

(13) The method for manufacturing a ferroelectric film according to any one of the above (1) to (12), wherein the mold is formed of an oxide.

(14) The method for manufacturing a ferroelectric film according to the above (13), wherein the oxide is a porous ceramics.

(15) The method for manufacturing a ferroelectric film according to the above (13) or (14), wherein the oxide is a second crystalline oxide film preferentially oriented to (001).

According to the method for manufacturing a ferroelectric film, since the mold is formed of the second crystalline oxide film preferentially oriented to (001), the $(K_{1-X}Na_X)NbO_3$ material film can be crystallized, preferentially oriented to (001).

(16) The method for manufacturing a ferroelectric film according to the above (15), wherein said second crystalline oxide film is a bismuth layered-structure ferroelectric film having a perovskite structure or a tungsten-bronze type ferroelectric film.

(17) The method for manufacturing a ferroelectric film according to the above (10) or (16), wherein said bismuth layered-structure ferroelectric film is a $Bi_4Ti_3O_{12}$ film or a $(Bi_{3.25}La_{0.75})Ti_3O_{12}$ film.

(18) The method for manufacturing a ferroelectric film according to any one of the above (1) or (17), wherein said heat treatment is carried out in a pressure range of 0.0993 to 1.986 MPa.

Advantageous Effects of the Invention

According to an aspect of the present invention, a method for manufacturing a ferroelectric film formed of a lead-free material can be provided.

BEST MODE FOR CARRYING OUT THE INVENTION

Hereinafter, the embodiment of the present invention will be explained particularly using the drawings. However, a person skilled in the art would understand easily that the present invention is not limited to the explanations below, but that the form and detail thereof are changeable variously without deviating from the purport and the scope of the present invention. Accordingly, the present invention should not be construed as being limited to the described contents of the embodiment shown below.

The ferroelectric film formed of a lead-free material according to an aspect of the present invention is a $(K_{1-X}Na_X)NbO_3$ film formed of a perovskite structure, and X preferably satisfies a formula (1) below.

$$0.3 \leq X \leq 0.7 \quad (1)$$

Since the $(K_{1-X}Na_X)NbO_3$ film is very hard and brittle, a mechanical working and processing by etching are difficult. Therefore, processing method below was found.

FIG. 1 to FIG. 6 are cross-sectional views for explaining the method for manufacturing a ferroelectric film according to an aspect of the present invention.

Figure 1:
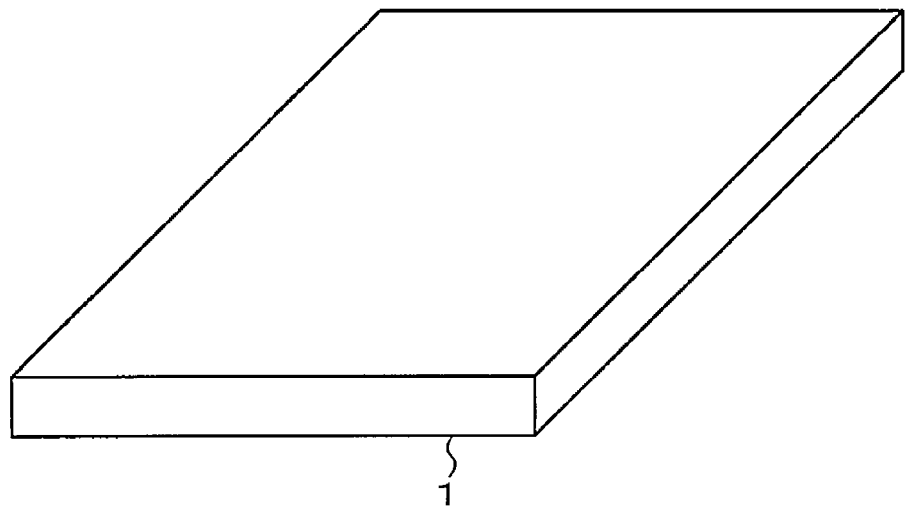
FIG. 1 is a cross-sectional view that explains the method for manufacturing a ferroelectric film according to an aspect of the present invention.
Figure 2:
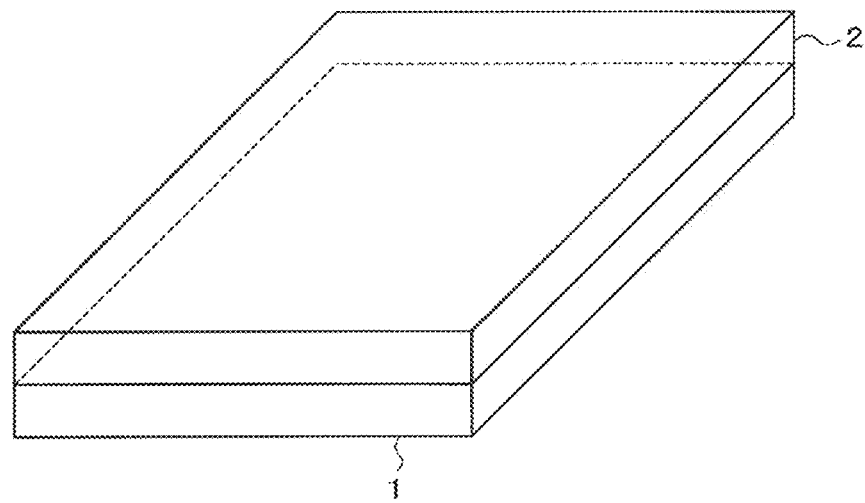
FIG. 2(A) is a cross-sectional view that explains the method for manufacturing a ferroelectric film according to an aspect of the present invention.
FIG. 2(B) is a SEM photograph of a PZT film.
Figure 2:
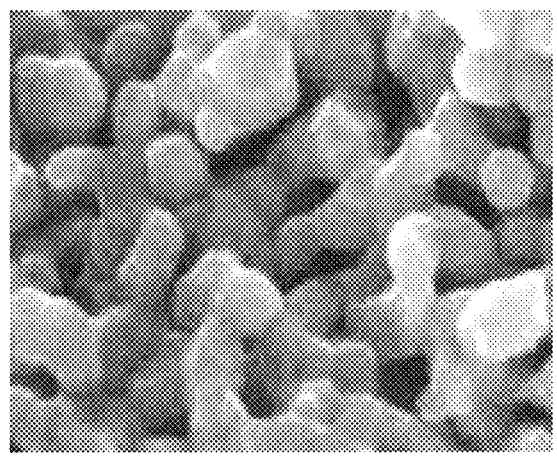

First, as shown in FIG. 1, a substrate 1 is prepared. As the substrate 1, substrates formed of various materials can be used, and in the present embodiment, there is used a substrate in which a $SiO_2$ film is formed on a substrate like a Si wafer, a Ti film is formed on the $SiO_2$ film, the Ti film is subjected to an oxidation treatment and a first electrode oriented to a prescribed crystal plane is formed thereon. As the first electrode, for example, a (111)-oriented Pt film or Ir film is used.

Figure 7:
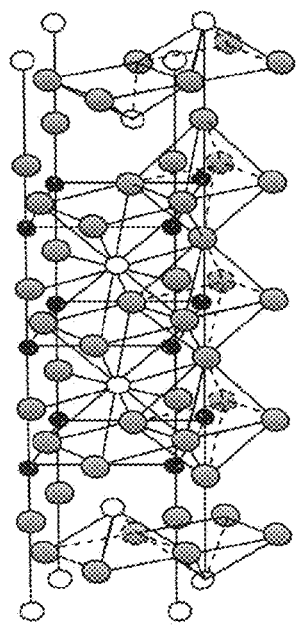
FIG. 7 is a drawing that shows a crystal structure of BIT (BLT) being a bismuth layered-structure ferroelectric substance.

Next, as shown in FIG. 2(A), a material film 2 for forming a mold is formed on the substrate 1 having the first electrode (not shown). The material film 2 may be a material capable of being more easily etched than the $(K_{1-X}Na_X)NbO_3$ film, and, for example, is formed of an oxide that is easily dissolved in an etching liquid or the like. Furthermore, the material film 2 may be a porous ceramics. This is because, when material film 2 is porous, it is easily dissolved in an etching liquid or the like. Moreover, the material film 2 is favorably a crystalline oxide film preferentially oriented to (001), and the crystalline oxide film includes a bismuth layered-structure ferroelectric film having a perovskite structure or a tungsten-bronze type ferroelectric film. The bismuth layered-structure ferroelectric film includes, as shown in FIG. 7, for example, $Bi_4Ti_3O_{12}$ being BIT or $(Bi_{4-x}La_x)Ti_3O_{12}$ being BLT, and is specifically $(Bi_{3.25}La_{0.75})Ti_3O_{12}$. Meanwhile, x satisfies the formula below $$0 < x < 1.$$

In addition, details of the tungsten-bronze type ferroelectric film will be described later.

Meanwhile, in the present embodiment, a porous PZT film is used as the material film 2, and a SEM photograph of the PZT film is shown in FIG. 2(B). The material film 2 is produced by coating a sol-gel solution for forming a PZT film on the substrate 1 through a spin-coating method to thereby form a coated film, calcining the coated film, and repeating the formation and calcination of the coated film, to thereby form a plurality of coated films on the substrate 1.

Figure 3:
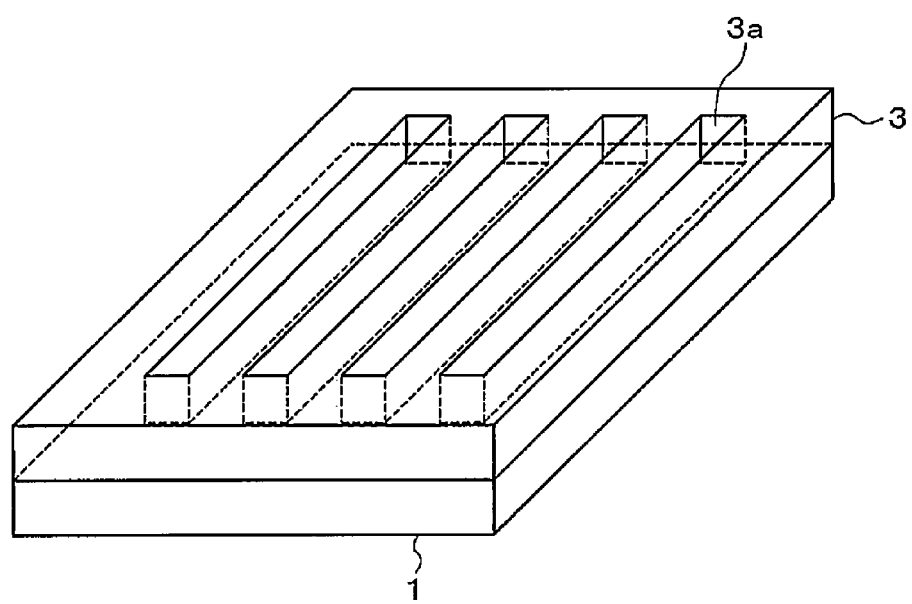
FIG. 3 is a cross-sectional view that explains the method for manufacturing a ferroelectric film according to an aspect of the present invention.
Figure 4:
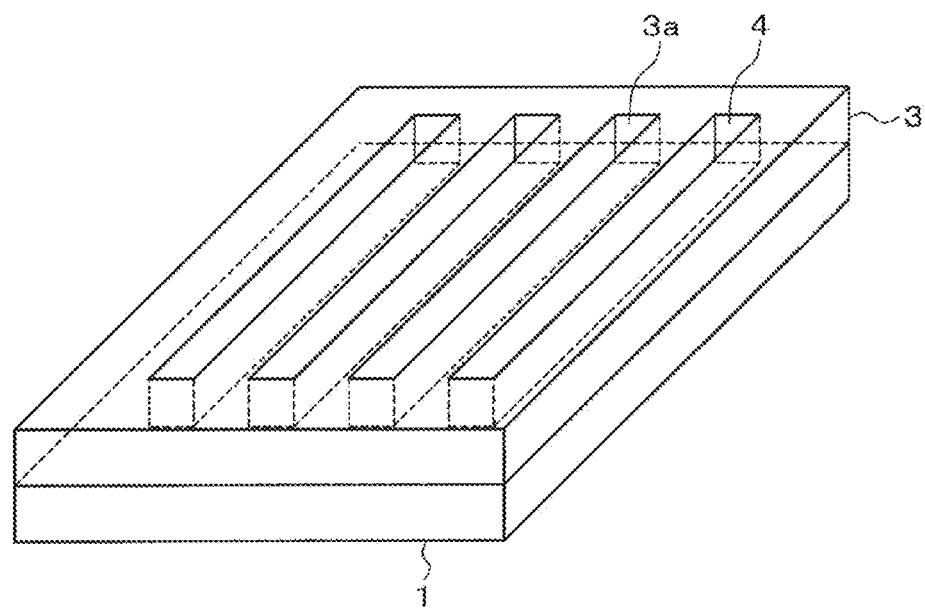
FIG. 4(A) is a cross-sectional view that explains the method for manufacturing a ferroelectric film according to an aspect of the present invention.
FIG. 4(B) is a SEM photograph of a $(K_{1-X}Na_X)NbO_3$ crystallized film.
Figure 4:
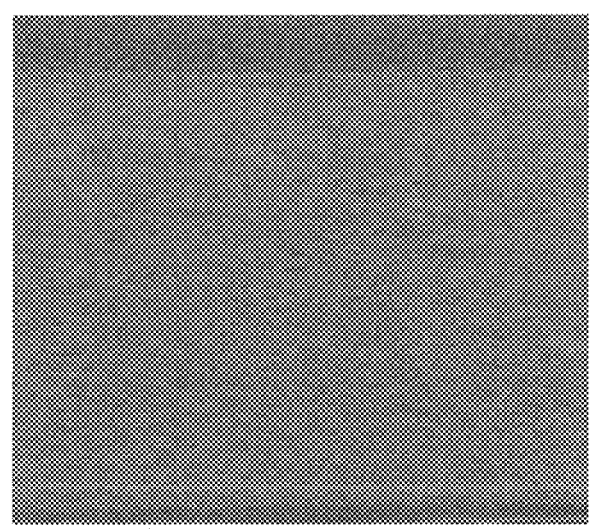

Next, as shown in FIG. 3, a resist film (not shown) is formed on the material film 2, and by wet etching or dry etching through the use of the resist film as a mask, a plurality of openings 3a in a line shape passing through the material film is formed on the substrate 1. Subsequently, the resist film is removed. As described above, a mold 3 having the plurality of openings 3a in a line shape is formed on the substrate 1, and the first electrode is exposed by the opening 3a.

Next, as shown in FIG. 4(A), on the first electrode inside the opening 3a of the mold 3, by coating, through a spin-coating method, a sol-gel solution for forming a crystalline oxide film preferentially oriented to (001), a coated film is formed, and by calcining the coated film, a material film for forming a crystalline oxide film (not shown) formed of the coated film is deposited.

Next, there is prepared a sol-gel solution for forming a $(K_{1-X}Na_X)NbO_3$ film 4 on the material film for forming a crystalline oxide film inside the opening 3a of the mold 3. The sol-gel solution contains a raw material solution including a hetero polyacid including K, Na and Nb, polar solvents and unsaturated fatty acids. The total concentration of K, Na and Nb contained in the sol-gel solution is favorably 10 to 50 mol %.

The sol-gel solution has, as a constituent element, a hetero polyacid ion having a Keggin-type structure in which the molecular structure is caused to be noncentrosymmetric to thereby express nonlinearity, and contains, as a part of a precursor structure of ferroelectric ceramics, a hetero polyacid ion in which at least one polyatom is lost or a hetero polyacid ion in which a part of the polyatom of the hetero polyacid ion has been substituted by another atom.

The above-mentioned hetero polyacid ion is one having a Keggin-type structure as represented by a following general formula: $[XM_yM'_{12-y}O_{40}]^{n-}$ (in the formula, X is a hetero atom, M is a polyatom, M' is a polyatom different from M, n is a valence number, and y=1 to 11), and the hetero polyacid ion is contained as a part of a precursor structure of ferroelectric ceramics.

Furthermore, the above-mentioned hetero polyacid ion may be one having a Keggin-type structure represented by a general formula: $[XM_{11}O_{39}]^{n-}$ (in the formula, X is a hetero atom, M is a polyatom, and n is a valence number), and the hetero polyacid ion is contained as a part of a precursor structure of ferroelectric ceramics.

Moreover, the above-mentioned hetero polyacid ion is one having a Keggin-type structure represented by a general formula: $[XM_zM'_{11-z}O_{39}]^{n-1}$ (in the formula, X is a hetero atom, M is a polyatom, M' is a polyatom different from M, n is a valence number, and z=1 to 10), and the hetero polyacid ion is contained as a part of a precursor structure of ferroelectric ceramics.

In the above-mentioned hetero polyacid ion, it is also possible for the hetero atom to be selected from a group consisting of B, Si, P, S, Ge, As, Mn, Fe and Co and for the polyatom to be selected from the group consisting of Mo, V, W, Ti, Al, Nb and Ta, and the hetero polyacid ion may be contained as apart of a precursor structure of ferroelectric ceramics.

The polar solvents are any of methyl ethyl ketone, 1,4-dioxane, 1,2-dimethoxyethane acetamide, M-methyl-2-pyrrolidone, acetonitrile, dichloromethane, nitromethane, trichloromethane, dimethylformamide, monomethylformamide or a plurality of combinations thereof.

The unsaturated fatty acid is any of mono-unsaturated fatty acids, di-unsaturated fatty acids, tri-unsaturated fatty acids, tetra-unsaturated fatty acids, penta-unsaturated fatty acids and hexa-unsaturated fatty acids or a plurality of combinations thereof.

Examples of the mono-unsaturated fatty acids include crotonic acid, myristoleic acid, palmitoleic acid, oleic acid, elaidic acid, vaccenic acid, gadoleic acid, eicosenoic acid, erucic acid and nervonic acid, and any of these or a plurality of combinations thereof may be used.

Examples of the di-unsaturated fatty acids include linoleic acid, eicosadienoic acid and docosadienoic acid, and any of these or a plurality of combinations thereof may be used.

Examples of the tri-unsaturated fatty acids include linolenic acid, pinolenic acid, eleostearic acid, Mead acid, dihomo-γ-linolenic acid and eicosatrienoic acid, and any of these or a plurality of combinations thereof may be used.

Examples of the tetra-unsaturated fatty acids include stearidonic acid, arachidonic acid, eicosatetraenoic acid and adrenic acid, and any of these or a plurality of combinations thereof may be used.

Examples of the penta-unsaturated fatty acids include bosseopentaenoic acid, eicosapentaenoic acid, osbond acid, clupanodonic acid and tetracosapentaenoic acid, and any of these or a plurality of combinations thereof may be used.

Examples of the hexa-unsaturated fatty acids include docosahexaenoic acid and nisinic acid, and any of these or a plurality of combinations thereof may be used.

Next, on the material film for forming a crystalline oxide film inside the opening 3a of the mold 3, the sol-gel solution is coated. The result of measuring a contact angle of the sol-gel solution with the substrate gave 20° or less. Meanwhile, it suffices that the contact angle with a substrate is 1 to 40° (preferably 1 to 20°).

The coating of the sol-gel solution is carried out by a spin-coating method. Consequently, a coated film is formed on the material film for forming a crystalline oxide film inside the opening 3a of the mold 3, and by calcination of the coated film at a temperature of 25 to 450° C. (preferably at a temperature of 450° C.), the $(K_{1-x}Na_x)NbO_3$ material film formed of the coated film is deposited on the material film for forming a crystalline oxide film. Meanwhile, by repeating the formation and calcination of the coated film a plurality of times, the $(K_{1-x}Na_x)NbO_3$ material film formed of a plurality of the coated films may be deposited on the material film for forming a crystalline oxide film.

Next, on the $(K_{1-x}Na_x)NbO_3$ material film inside the opening 3a of the mold 3, a material film for forming a crystalline oxide film (not shown) is deposited. As the material film for forming a crystalline oxide film, there can be used one that is the same as the above-mentioned material film for forming a crystalline oxide film.

Next, in the same way as the above, on the material film for forming a crystalline oxide film inside the opening 3a of the mold 3, the $(K_{1-x}Na_x)NbO_3$ material film is deposited. Meanwhile, in the opening 3a of the mold 3, the material film for forming a crystalline oxide film and the $(K_{1-x}Na_x)NbO_3$ material film may be further deposited repeatedly.

Figure 5:
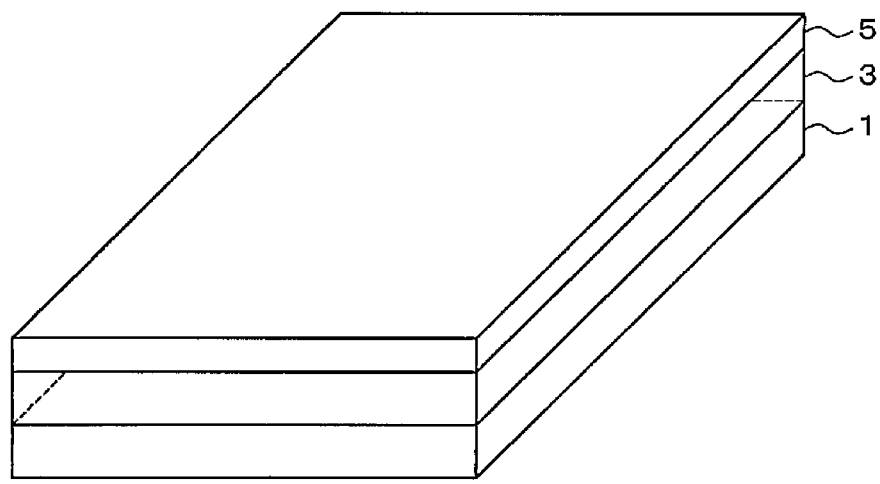
FIG. 5 is a cross-sectional view that explains the method for manufacturing a ferroelectric film according to an aspect of the present invention.

Next, as shown in FIG. 5, on the mold 3 and the $(K_{1-x}Na_x)NbO_3$ material film, a second electrode material film 5 is formed. In the present embodiment, a Pt film is used as the second electrode material film 5.

Next, the material film for forming a crystalline oxide film and the $(K_{1-x}Na_x)NbO_3$ material film are crystallized by a method below.

By heat-treating the material film for forming a crystalline oxide film and the $(K_{1-x}Na_x)NbO_3$ material film in an oxygen atmosphere at a temperature of 450 to 900° C. (preferably, 900° C.), these can be crystallized. As to the condition at this time, the heat treatment may be carried out in a pressure range of 0.0993 to 1.986 MPa. Furthermore, as to conditions of the heat treatment at this time, the calcination may be carried out for 1 to 5 minutes in a pressurized oxygen atmosphere of 2 to 20 atm, at a temperature rising rate of 50 to 150° C./sec. Moreover, the thickness of the $(K_{1-x}Na_x)NbO_3$ material film when crystallizing together the $(K_{1-x}Na_x)NbO_3$ material film is preferably 300 nm or more.

As described above, the crystalline oxide film (not shown) obtained by crystallizing the material film for forming a crystalline oxide film is preferentially oriented to (001), and in the crystallized $(K_{1-x}Na_x)NbO_3$ crystallized film, it is preferable that X satisfies the formula (1) below.

$$0.3 \leq X \leq 0.7 \quad (1)$$

Figure 9:
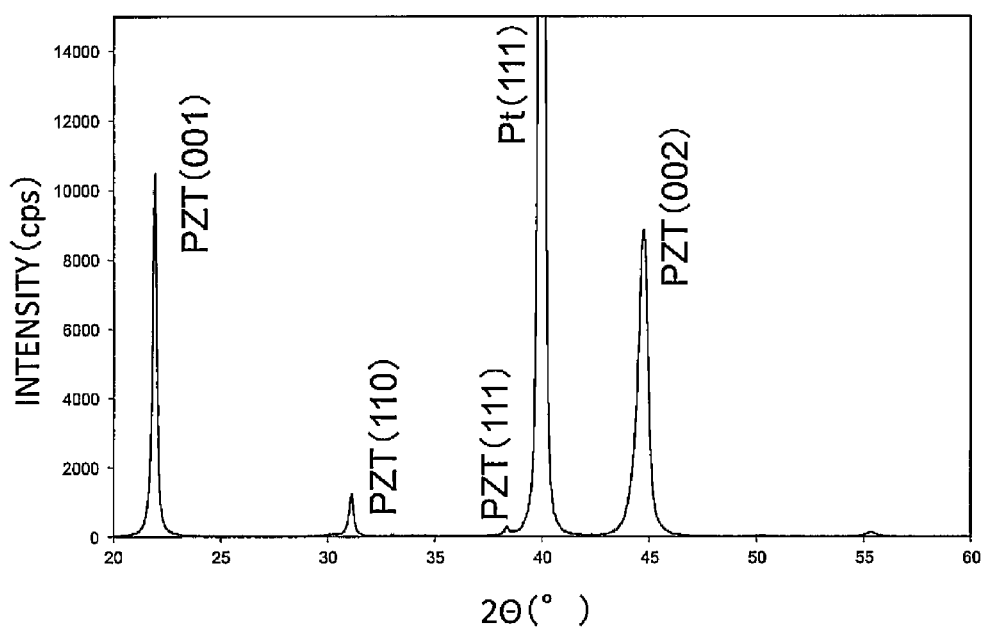
FIG. 9 is a drawing that shows a representative XRD chart of c-axis oriented PZT.

The preferential orientation indicates the case where the strongest peak is twice or more as compared with the second strongest peak, among respective peaks in a Θ-2Θ analysis chart when X-ray structural analysis is carried out. A specific explanation will be given using, for example, FIG. 9. However, the XRD reflection intensity on the ordinate axis in FIG. 9 is of an analog intensity representation (cps), and a logarithmic representation is not used. The next to the strongest peak (001) among respective peaks of the PZT is (110) and, since there is a twice or more difference in the strength, the (001) is referred to as the preferential orientation.

By preferentially orienting the crystalline oxide film to (001), the $(K_{1-x}Na_x)NbO_3$ crystallized film can be oriented to (001) and as a result, piezoelectric properties can be enhanced. Meanwhile, the $(K_{1-x}Na_x)NbO_3$ crystallized film is, as shown by the SEM photograph in FIG. 4(B), a film that is dense and difficult to be etched.

The $(K_{1-x}Na_x)NbO_3$ crystallized film scarcely contains an air bubble even when it is a thick film with a thickness of 500 nm or more. In other words, by depositing a film according to this procedure, an excellent thick film can be formed. The reason is that the film is formed of a structure in which organic components disappear almost in the thickness direction, the film scarcely shrinks in the substrate surface, and the shrinkage is to the extent of being compensated by expansion due to oxidation. Accordingly, the substrate scarcely exhibits warpage.

Meanwhile, by repeating the formation and crystallization of the above-mentioned $(K_{1-x}Na_x)NbO_3$ material film and the material film for forming a crystalline oxide film, it is also possible to form the $(K_{1-x}Na_x)NbO_3$ crystallized film with a thickness of 2 μm or more.

Further, the total thickness of the crystalline oxide film crystallized as described above is 1 to 30 nm, preferably from 15 to 25 nm, and more preferably 20 nm.

The crystal in the crystalline oxide film serves as a nucleus when crystallizing the $(K_{1-x}Na_x)NbO_3$ material film, and thus it becomes possible to proceed promptly with the crystallization of the $(K_{1-x}Na_x)NbO_3$ material film that is difficult to be crystallized into the perovskite structure. Since the crystalline oxide film acts as the nucleus in the crystallization in this way, it suffices that the crystalline oxide film has been formed on at least one of the upper side and lower side of the $(K_{1-x}Na_x)NbO_3$ material film.

The second electrode material film 5 that covers on the $(K_{1-x}Na_x)NbO_3$ material film 4 functions also as a blocking film. The blocking film functions so as to suppress the separation of K and Na from the inside of the $(K_{1-x}Na_x)NbO_3$ material film 4 when the $(K_{1-x}Na_x)NbO_3$ material film 4 is heat-treated to be crystallized in an oxygen atmosphere.

Furthermore, the crystalline oxide film has preferably higher dielectric constant than the $(K_{1-x}Na_x)NbO_3$ crystallized film being a ferroelectric film. The "higher dielectric constant" referred to here means that the dielectric constant of the whole crystalline oxide film is higher than the dielectric constant of the whole ferroelectric film, that is, it means so-called real dielectric constant. Consequently, when a voltage is applied serially to the crystalline oxide film and the $(K_{1-x}Na_x)NbO_3$ crystallized film, an electric field is added to the $(K_{1-x}Na_x)NbO_3$ crystallized film having lower dielectric constant.

Figure 6:
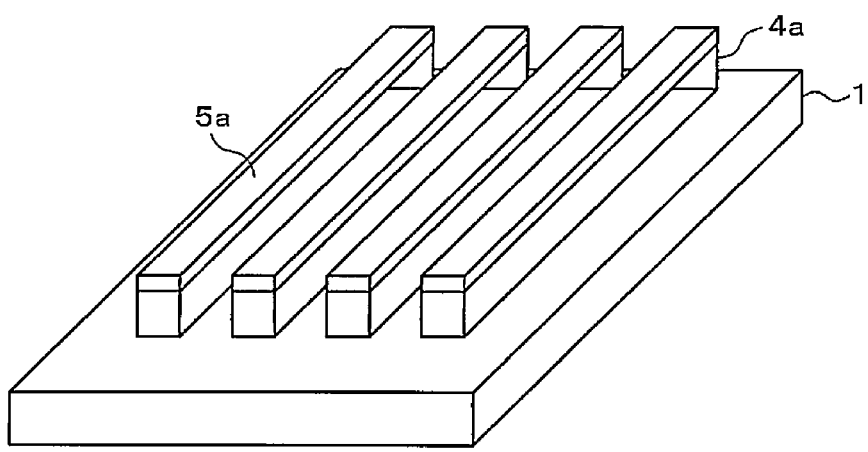
FIG. 6 is a cross-sectional view that explains the method for manufacturing a ferroelectric film according to an aspect of the present invention.

Next, as shown in FIG. 6, by removal of the mold 3 by etching, a $(K_{1-x}Na_x)NbO_3$ crystallized film 4a is exposed and the second electrode material film 5 is lifted off to be left on the $(K_{1-x}Na_x)NbO_3$ crystallized film 4a. As a result, the $(K_{1-x}Na_x)NbO_3$ crystallized film 4a is formed on the first electrode of the substrate 1, and on the $(K_{1-x}Na_x)NbO_3$ crystallized film 4a, a second electrode 5a is formed.

According to the present embodiment, the $(K_{1-x}Na_x)NbO_3$ crystallized film 4a that is a ferroelectric film formed of a lead-free material, can be produced.

In addition, the first electrode is formed under the $(K_{1-x}Na_x)NbO_3$ crystallized film 4a and the second electrode is formed on the $(K_{1-X}Na_X)NbO_3$ crystallized film 4a, and thus the application of a voltage between the first electrode and the second electrode makes it possible for the $(K_{1-X}Na_X)NbO_3$ crystallized film 4a to function as a piezoelectric element.

Furthermore, in the present embodiment, by the use of a crystalline oxide film preferentially oriented to (001), the $(K_{1-X}Na_X)NbO_3$ material film 4 can be crystallized, oriented to (001), and as a result, piezoelectric properties of the $(K_{1-X}Na_X)NbO_3$ crystallized film can be enhanced.

In addition, when a crystalline oxide film preferentially oriented to (001) is used as the material film 2 for forming the mold 3, the crystalline oxide film is useful for crystallizing the $(K_{1-X}Na_X)NbO_3$ material film 4, oriented to (001), and as a result, piezoelectric properties of the $(K_{1-X}Na_X)NbO_3$ crystallized film can be enhanced.

Furthermore, according to the present embodiment, since a heat treatment for crystallization is carried out in a state where the $(K_{1-X}Na_X)NbO_3$ material film 4 is sandwiched between the substrate 1 and the second electrode material film 5, it is possible to suppress the escape of K and Na in the $(K_{1-X}Na_X)NbO_3$ material film 4 and it is possible to improve film properties of the $(K_{1-X}Na_X)NbO_3$ crystallized film 4a.

Moreover, by adopting a pressurized oxygen atmosphere when carrying out a heat treatment for crystallizing the $(K_{1-X}Na_X)NbO_3$ material film 4, it is possible to suppress the escape of K and Na in the $(K_{1-X}Na_X)NbO_3$ material film 4 and it is possible to improve film properties of the $(K_{1-X}Na_X)NbO_3$ crystallized film 4a.

In addition, the crystalline oxide film is preferably a bismuth layered-structure ferroelectric film having a perovskite structure or a tungsten-bronze type ferroelectric film.

It is known that the bismuth layered-structure ferroelectric substance has an anisotropic property in the crystal growth direction thereof due to a unique crystal structure thereof (paper, Takeshi Kijima et al.: Jpn. J. Appl. Phys. 35 (1996) 1246). The bismuth layered-structure ferroelectric substance has characteristics of being quickly preferentially oriented to (001) to be crystallized (characteristics of being oriented automatically to (001) being c-axis oriented, to thereby be crystallized, even on a Pt film oriented to, for example, (111)), and has a crystal structure represented by a general formula $(Bi_2O_2)^{2+}(A_{m-1}B_mO_{3m+1})^{2-}$ (m=1 to 5) or $Bi_2A_{m-1}B_mO_{3m+3}$ (m=1 to 5), the structure in which a plurality of pseudo-perovskite structures is interposed between $(Bi_2O_2)^{2+}$ layers. Here, m shows the number of oxygen octahedrons in a pseudo-perovskite layer in a unit lattice. The ferroelectric substance is considered to exhibit ferroelectricity through slight rotation or inclination of the oxygen octahedron with the center of a B site ion, as in the case of a tungsten-bronze type ferroelectric substance, and has large piezoelectric anisotropy as in the case of the tungsten-bronze structure.

As shown in FIG. 7, examples of the bismuth layered-structure ferroelectric substances include $Bi_4Ti_3O_{12}$ being BIT or $(Bi_{4-x}La_x)Ti_3O_{12}$ being BLT, and is, specifically, $(Bi_{3.25}La_{0.75})Ti_3O_{12}$. Meanwhile, x satisfies a formula below 0<x<1.

Figure 8:
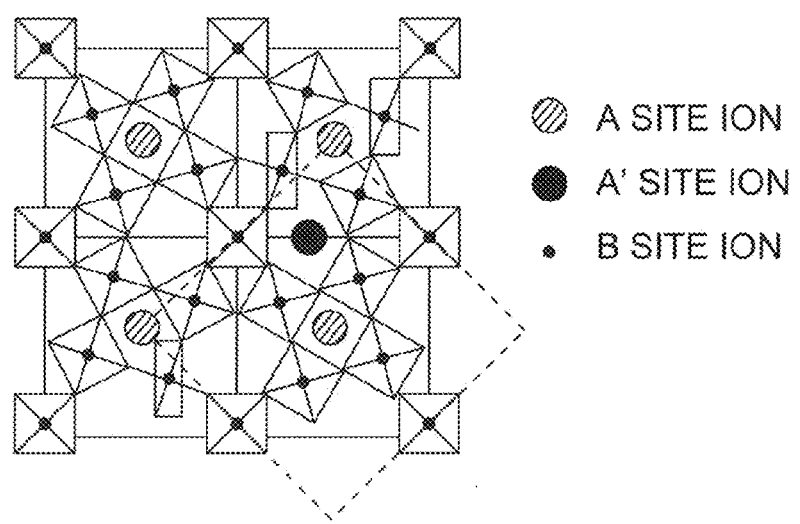
FIG. 8 is a drawing that shows schematically a tungsten-bronze type crystal structure.

The crystal structure of the tungsten-bronze type ferroelectric substance is a crystal structure found through studies on sodium tungstate $(Na_xWO_3)$, x=0.0 to 1.0. The sodium tungstate takes on gold color in the composition of x=1.0, and is generally referred to as the tungsten-bronze type crystal structure. A tungsten-bronze compound has a basic structure of $A_xBO_3$ (x<1), in which a part of A site ions in the perovskite structure $ABO_3$ is lost, and is represented generally by a composition formula of a form in which the whole has been subjected to an integral multiple. In FIG. 8, a typical tungsten-bronze type crystal structure is shown. A ferroelectric substance of the present structure expresses ferroelectric properties through slight rotation or inclination of the oxygen octahedron constituted by six oxygen ions with the center of a B site ion, along with the change in an electric field. As a typical lead-free piezoelectric ceramics material of this structure, there exists $Ba_2NaNb_5O_{15}$.

Meanwhile, in the present embodiment, the ferroelectric film has a stacked-layer structure of the crystalline oxide film and the $(K_{1-X}Na_X)NbO_3$ crystallized film, but the ferroelectric film may have a single-layer structure of the $(K_{1-X}Na_X)NbO_3$ crystallized film.

The invention claimed is:

1. A method for manufacturing a ferroelectric film, comprising the steps of:
    pouring a sol-gel solution for forming $(K_{1-X}Na_X)NbO_3$ into a mold;
    forming, by calcining said sol-gel solution, a $(K_{1-X}Na_X)NbO_3$ material film in said mold;
    forming, by heat-treating and crystallizing said $(K_{1-X}Na_X)NbO_3$ material film in an oxygen atmosphere, a $(K_{1-X}Na_X)NbO_3$ crystallized film in said mold; and
    removing said mold through etching, wherein
    said mold is more easily etched than said $(K_{1-X}Na_X)NbO_3$ crystallized film; and
    said X satisfies the formula below $0.3 \leq X \leq 0.7$.

2. The method for manufacturing a ferroelectric film according to claim 1,
    wherein the total concentration of K, Na and Nb contained in said sol-gel solution is 10 mol % to 50 mol %.

3. The method for manufacturing a ferroelectric film according to claim 1,
    wherein, when forming said $(K_{1-X}Na_X)NbO_3$ material film, a $(K_{1-X}Na_X)NbO_3$ material film is formed by repeating a plurality of times the pouring of said sol-gel solution and said calcination.

4. The method for manufacturing a ferroelectric film according to claim 1,
    wherein a first crystalline oxide film preferentially oriented to (001) is formed, in a contact state, on at least one of the upper side and lower side of said $(K_{1-X}Na_X)NbO_3$ crystallized film.

5. The method for manufacturing a ferroelectric film according to claim 4,
    wherein said first crystalline oxide film is a bismuth layered-structure ferroelectric film having a perovskite structure or a tungsten-bronze type ferroelectric film.

6. The method for manufacturing a ferroelectric film according to claim 5,
    wherein said bismuth layered-structure ferroelectric film is a $Bi_4Ti_3O_{12}$ film or a $(Bi_{3.25}La_{0.75})Ti_3O_{12}$ film.

7. The method for manufacturing a ferroelectric film according to claim 4,
    wherein said first crystalline oxide film is formed in an island shape or in a film shape.

8. The method for manufacturing a ferroelectric film according to claim 4,
    wherein thickness of said first crystalline oxide film is 2 nm to 30 nm.

9. The method for manufacturing a ferroelectric film according to claim 1,
    wherein said mold is formed of an oxide.

10. The method for manufacturing a ferroelectric film according to claim 9,
wherein said oxide is a porous ceramics.

11. The method for manufacturing a ferroelectric film according to claim 9,
wherein said oxide is a second crystalline oxide film preferentially oriented to (001).

12. The method for manufacturing a ferroelectric film according to claim 11,
wherein said second crystalline oxide film is a bismuth layered-structure ferroelectric film having a perovskite structure or a tungsten-bronze type ferroelectric film.

13. The method for manufacturing a ferroelectric film according to claim 1,
wherein said heat treatment is carried out in a pressure range of 0.0993 MPa to 1.986 MPa.

14. A method for manufacturing a ferroelectric film, comprising the steps of:
forming a mold on a substrate;
pouring a sol-gel solution for forming $(K_{1-X}Na_X)NbO_3$ into said mold;
forming, by calcining said sol-gel solution, a $(K_{1-X}Na_X)NbO_3$ material film in said mold;
forming, by heat-treating and crystallizing said $(K_{1-X}Na_X)NbO_3$ material film in an oxygen atmosphere, a $(K_{1-X}Na_X)NbO_3$ crystallized film in said mold; and
forming, by removing said mold through etching, said $(K_{1-X}Na_X)NbO_3$ crystallized film on said substrate, wherein
said X satisfies the formula below $0.3 \leq X \leq 0.7$.

15. The method for manufacturing a ferroelectric film according to claim 14,
wherein the total concentration of K, Na and Nb contained in said sol-gel solution is 10 mol % to 50 mol %.

16. The method for manufacturing a ferroelectric film according to claim 14,
wherein, when forming said $(K_{1-X}Na_X)NbO_3$ material film, a $(K_{1-X}Na_X)NbO_3$ material film is formed by repeating a plurality of times the pouring of said sol-gel solution and said calcination.

17. The method for manufacturing a ferroelectric film according to claim 14,
wherein a first crystalline oxide film preferentially oriented to (001) is formed, in a contact state, on at least one of the upper side and lower side of said $(K_{1-X}Na_X)NbO_3$ crystallized film.

18. The method for manufacturing a ferroelectric film according to claim 14,
wherein said mold is formed of an oxide.

19. A method for manufacturing a ferroelectric film, comprising the steps of:
forming a first electrode on a substrate;
forming a mold on said first electrode and said substrate;
pouring a sol-gel solution for forming $(K_{1-X}Na_X)NbO_3$ into said mold;
forming, by calcining said sol-gel solution, a $(K_{1-X}Na_X)NbO_3$ material film in said mold;
forming, by heat-treating and crystallizing said $(K_{1-X}Na_X)NbO_3$ material film in an oxygen atmosphere, $(K_{1-X}Na_X)NbO_3$ crystallized film in said mold; and
forming, by removing said mold through etching, said $(K_{1-X}Na_X)NbO_3$ crystallized film on said first electrode, wherein
said X satisfies the formula below $0.3 \leq X \leq 0.7$.

20. The method for manufacturing a ferroelectric film according to claim 19, wherein:
after calcining said sol-gel solution and before heat-treating said $(K_{1-X}Na_X)NbO_3$ material film, an electrode material film is formed on said $(K_{1-X}Na_X)NbO_3$ material film and said mold; and
by removing said electrode material film positioned on said mold when removing said mold through etching, a second electrode formed of said electrode material film is formed on said $(K_{1-X}Na_X)NbO_3$ crystallized film.

21. The method for manufacturing a ferroelectric film according to claim 19,
wherein the total concentration of K, Na and Nb contained in said sol-gel solution is 10 mol % to 50 mol %.

22. The method for manufacturing a ferroelectric film according to claim 19,
wherein, when forming said $(K_{1-X}Na_X)NbO_3$ material film, a $(K_{1-X}Na_X)NbO_3$ material film is formed by repeating a plurality of times the pouring of said sol-gel solution and said calcination.

23. The method for manufacturing a ferroelectric film according to claim 19,
wherein a first crystalline oxide film preferentially oriented to (001) is formed, in a contact state, on at least one of the upper side and lower side of said $(K_{1-X}Na_X)NbO_3$ crystallized film.

24. The method for manufacturing a ferroelectric film according to claim 19,
wherein said mold is formed of an oxide.

25. A method for manufacturing a ferroelectric film, comprising the steps of:
forming a mold on a substrate;
pouring a first sol-gel solution for forming $(K_{1-X}Na_X)NbO_3$ into said mold;
forming, by calcining said first sol-gel solution, a first $(K_{1-X}Na_X)NbO_3$ material film in said mold;
pouring a second sol-gel solution for forming a first crystalline oxide film into said mold;
forming, by calcining said second sol-gel solution, a material film for forming a crystalline oxide film in said mold and on said first $(K_{1-X}Na_X)NbO_3$ material film;
pouring a third sol-gel solution for forming $(K_{1-X}Na_X)NbO_3$ into said mold;
forming, by calcining said third sol-gel solution, a second $(K_{1-X}Na_X)NbO_3$ material film in said mold and on said material film for forming a crystalline oxide film;
forming, by heat-treating and crystallizing said first $(K_{1-X}Na_X)NbO_3$ material film, said material film for forming a crystalline oxide film and said second $(K_{1-X}Na_X)NbO_3$ material film in an oxygen atmosphere, a first $(K_{1-X}Na_X)NbO_3$ crystallized film, a first crystalline oxide film preferentially oriented to (001) and a second $(K_{1-X}Na_X)NbO_3$ crystallized film stacked in order in said mold; and
removing said mold through etching, wherein
said X satisfies the formula below $0.3 \leq X \leq 0.7$.

26. The method for manufacturing a ferroelectric film according to claim 25,
wherein said first crystalline oxide film is a bismuth layered-structure ferroelectric film having a perovskite structure or a tungsten-bronze type ferroelectric film.

27. The method for manufacturing a ferroelectric film according to claim 25,
wherein said first crystalline oxide film is formed in an island shape or in a film shape.

28. The method for manufacturing a ferroelectric film according to claim 25,
   wherein thickness of said first crystalline oxide film is 2 nm to 30 nm.

29. The method for manufacturing a ferroelectric film according to claim 25,
   wherein said mold is formed of an oxide.

* * * * *